US006765466B2

(12) United States Patent
Miyata

(10) Patent No.: US 6,765,466 B2
(45) Date of Patent: Jul. 20, 2004

(54) MAGNETIC FIELD GENERATOR FOR MAGNETRON PLASMA

(75) Inventor: Koji Miyata, Fukui (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/449,598

(22) Filed: Jun. 2, 2003

(65) Prior Publication Data

US 2003/0222742 A1 Dec. 4, 2003

(30) Foreign Application Priority Data

Jun. 3, 2002 (JP) ........................................ 2002-161348

(51) Int. Cl.$^7$ ............................................. C23C 14/35
(52) U.S. Cl. ........................ 335/296; 335/297; 335/298; 335/306; 204/298.16; 204/298.19
(58) Field of Search ........................ 204/298.16–298.22, 204/298.37; 335/296–306

(56) References Cited

U.S. PATENT DOCUMENTS 5,262,028 A * 11/1993 Manley ................. 204/192.12
5,746,897 A * 5/1998 Heimanson et al. ..... 204/298.2

* cited by examiner

Primary Examiner—Ramon M. Barrera
(74) Attorney, Agent, or Firm—Sughrue Mion, PLLC

(57) ABSTRACT

A magnetic field generator for confining plasma within a vacuum chamber is disclosed. The magnetic field generator produces a multi-pole magnetic field around a workpiece positioned within the vacuum chamber. The magnetic field generator is provided outside the vacuum chamber and comprises a plurality of segment type permanent magnets circularly arranged. The magnetic field generator further comprises a plurality of magnetic members to which the segment type permanent magnets are selectively attached.

11 Claims, 7 Drawing Sheets

BEFORE RADIAL DISPLACEMENT

AFTER RADIAL DISPLACEMENT

CROSS SECTION OF
MAGNETIC MEMBER 30
IS TRAPEZOIDAL

CROSS SECTION OF
MAGNETIC MEMBER 30
IS FAN-SHAPED

CROSS SECTION OF
MAGNETIC MEMBER 30
IS RECTANGULAR

MAGNETIC FIELD GENERATOR FOR MAGNETRON PLASMA

BACKGROUND OF THE INVENTION

1. Field of the Invention

The present invention relates generally to a magnetic field generator, and more specifically to such a generator for effectively confining magnetron plasma which is produced within a vacuum chamber in which a workpiece is positioned so as to be subject to plasma treatment.

2. Description of Related Art

It is known in the art to generate magnetron plasma, within an evacuated process chamber (viz., vacuum chamber), for use in implementing plasma treatment such as etching, film growth, etc. on the workpiece such as a semiconductor wafer provided in the chamber.

Prior to turning to the present invention, it is deemed advantageous to briefly describe, with reference to FIG. 1, a conventional magnetic field generator via which the plasma produced within the vacuum chamber is confined, When performing the plasma treatment (processing) on the workpiece, it is vital to effectively confine plasma in a manner to surround the workpiece so as to obtain designed results.

As shown in FIG. 1, a semiconductor wafer (viz., workpiece) 10 is positioned at the center area of a vacuum chamber 12 in a manner to face the surface of the workpiece upward on which the plasma treatment is to be carried out. Although not shown in FIG. 1, plasma is generated within the vacuum chamber 12 by way of conventional technology. The plasma generation per se is not directly concerned with the present invention, and thus the further description thereof will be omitted for the sake of simplifying the instant disclosure.

In order to effectively confine plasma around the workpiece 10 with forming no magnetic field above the wafer 10 (or with permitting very week magnetic field above the wafer), a magnetic field generator (or multi-pole magnet unit) 14 is provided outside the vacuum chamber 12. The magnetic field generator 14 is comprised of a ring-like magnetic member (supporter) 16 and a plurality of segment type permanent magnets (hereinafter referred to as segment magnets) 18 attached to the inner side of the member 16. More specifically, the segment magnets 18 are arranged such as to alternately change the magnetic polarities thereof in the circumferential direction of the supporter 16, and thus, a multi-pole magnetic field is generated within the vacuum chamber 12 so as to confine the plasma around the workpiece 10. Small arrows on the segment magnets 18 respectively indicate the magnetized directions of the magnets 18, and curved lines 20 respectively indicate magnetic forth lines.

It is typical in the art, when constructing the magnetic field generator 14, to make use of the permanent magnets 18 rather than electromagnets because the electric power consumption can be zeroed and the structure of the apparatus can be simplified. On the other hand, a study made by the inventor of the instant application has revealed that the plasma treatment rate (i.e., etch rate) on the wafer surface depends on the strength of the multi-pole magnetic field. However, there has been no proposal to control the multi-pole magnetic field which is generated using a multiple of permanent magnets. In other words, a permanent magnet type conventional magnetic field generator is unable to adaptively control the magnetic field strength.

SUMMARY OF THE INVENTION

It is therefore an object of the present invention to provide a magnetic field generator wherein the strength of the multi-pole magnetic field generated thereby can adaptively be controlled.

One aspect of the present invention resides in a magnetic field generator for generating a multi-pole magnetic field around a workpiece positioned within a vacuum chamber. The magnetic field generator is provided outside the vacuum chamber and comprises a plurality of segment type permanent magnets circularly arranged. The magnetic field generator further comprises a plurality of magnetic members to which the segment magnets are selectively attached.

BRIEF DESCRIPTION OF THE DRAWINGS

The features and advantages of the present invention will become more clearly appreciated from the following description taken in conjunction with the accompanying drawings in which like elements or portions are denoted by like reference numerals and in which.

DETAILED DESCRIPTION OF THE PREFERRED EMBODIMENTS

Figure 1:
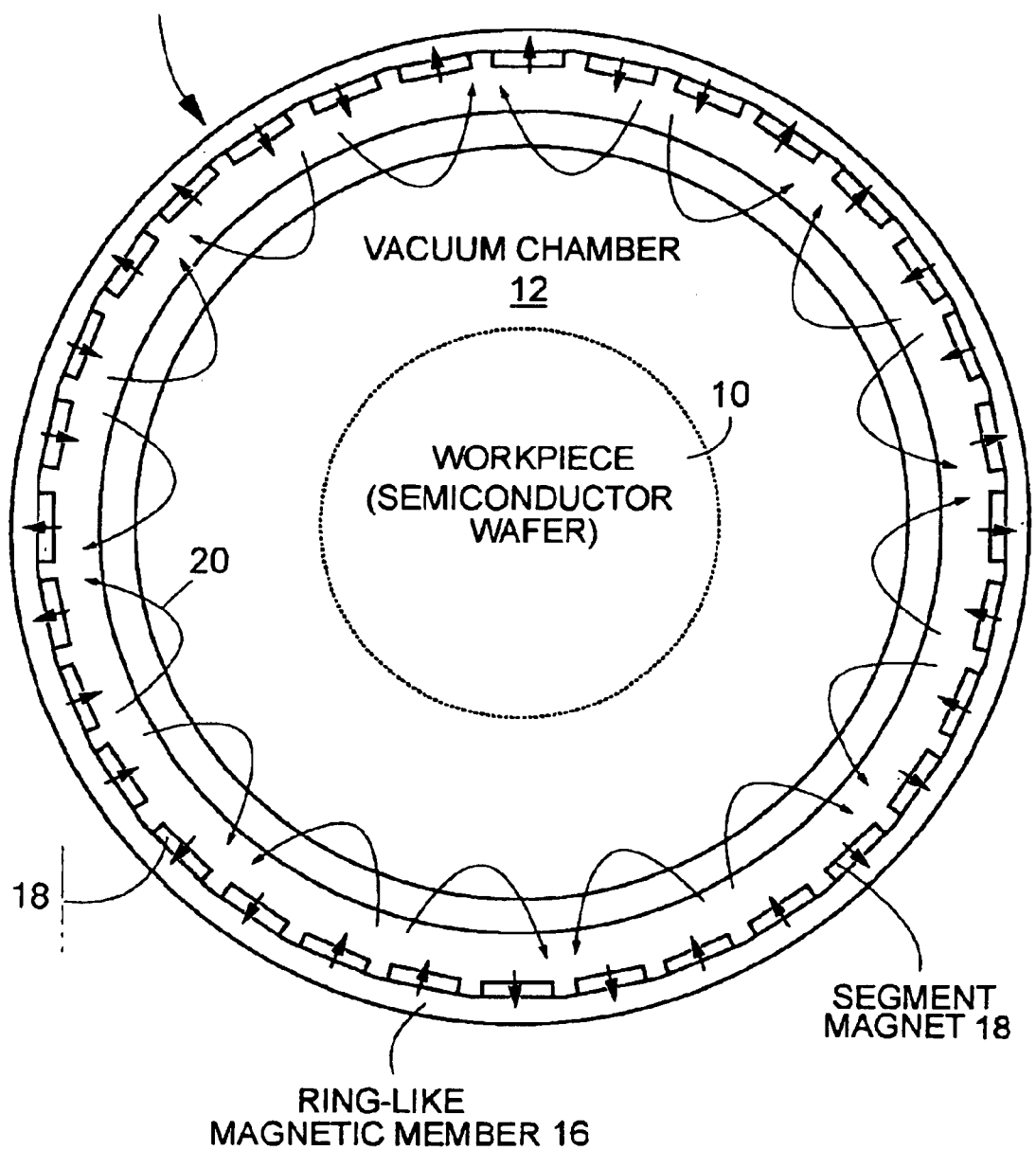
FIG. 1 is a plan view schematically showing a conventional magnetic field generator together with part of vacuum chamber, having been referred to in the opening paragraphs.
Figure 2:
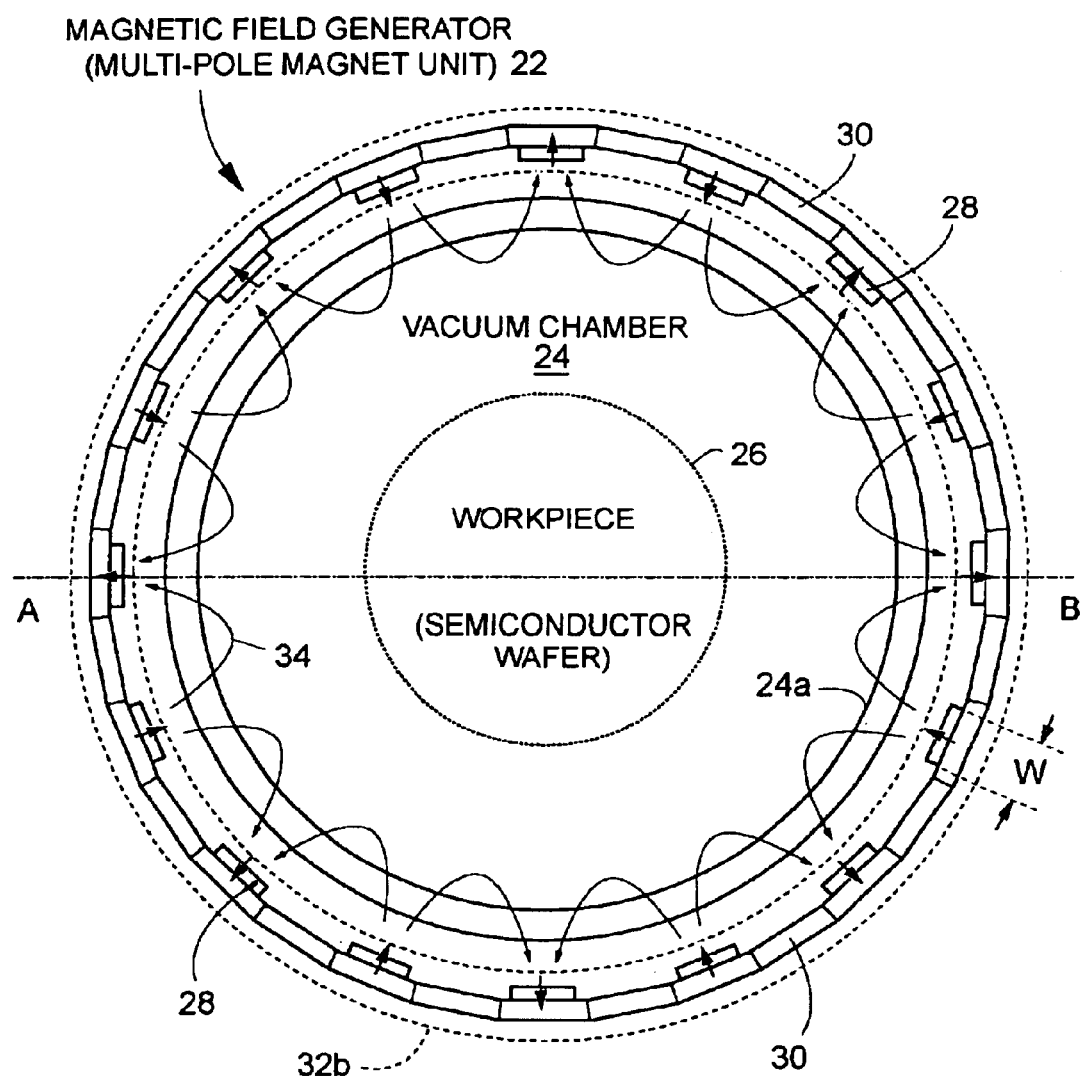
FIG. 2 is a plan view schematically showing a magnetic field generator together with part of a vacuum chamber according to a preferred embodiment of the present invention.
Figure 3:
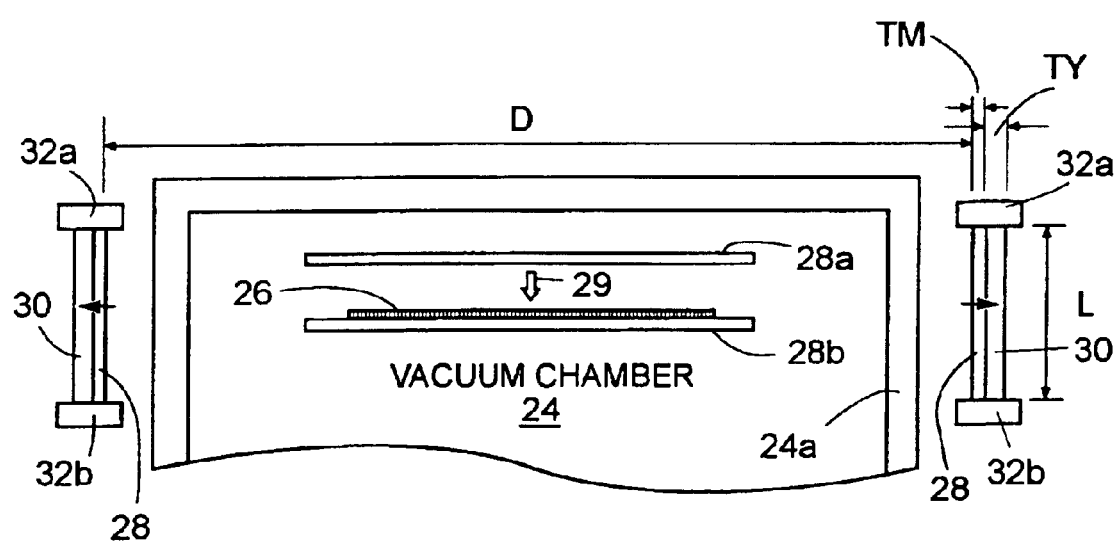
FIG. 3 is a sectional view taken along section line A-B of FIG. 1.

Reference is now made to FIGS. 2 and 3 wherein one preferred embodiment of the present invention is schematically illustrated.

FIG. 2 is a top plan view of a magnetic field generator (or multi-pole magnet unit) 22 and a vacuum chamber 24 (although only the vertical wall thereof 24a is shown). A workpiece 26 such as a semiconductor wafer is positioned within the vacuum chamber 24. In FIG. 2, a top wall of the vacuum chamber 24 is omitted for the convenience of illustrating the inside of the chamber 24. FIG. 3 is a cross section taken along section line A-B of FIG. 2.

As shown in FIG. 3, an upper and lower plate-like electrodes 28a and 28b are provided within the vacuum chamber 24. Although not shown in FIG. 3, a high frequency alternate voltage is applied to the two electrodes 28a and 28b so as to generate a plasma therebetween. An open arrow 29 indicates the direction of a high frequency electric field at a moment when the upper and lower electrodes 28 and 28b are respectively positive and negative. The workpiece 26, which is positioned on the lower electrode 28b, is subject to the plasma treatment such as etching, film growth, etc. The plasma generation per se is well known in the art, and the present invention is not directly concerned therewith, and as such, further description thereof will not be given for the sake of simplifying the instant disclosure.

The magnetic field generator 22 (FIG. 2) is installed in a manner to surround the vacuum chamber 24 so as to generate a multi-pole magnet field within the chamber 24 in order to confine magnetron plasma. The magnetic field generator 22 generally comprises a plurality of segment magnets 28 and a plurality of magnetic members 30. As shown in FIG. 2, the segment magnets 28 are alternately attached to the magnet members 30 which are arranged such as to be adjacent with each other forming a ring-like configuration. As best shown in FIG. 3, the magnetic members 30 are respectively supported at the upper and lower ends thereof by way of a pair of ring-like members 32a and 32b, each of which is made of a non-magnetic material such as aluminum, stainless steel, brass, synthetic resin, etc.

In the instant embodiment, the numbers of the magnetic members 30 and the segment magnets 28 are respectively 32 and 16 (see FIG. 2). The present invention is however in no way limited to such numbers. By way of example, the number of the magnetic members 30 may be in the range from 8 to 64, while the number of the segment magnets 28 is equal to or less than that of the magnetic members 30. The key of the present invention resides in the fact that the magnetic field generator 22 is comprised of a plurality of magnetic members 30.

The arrow attached to each of the segment magnets 28 indicates the magnetized direction thereof, and a plurality of curves 34 denote each a magnetic force line between the adjacent segment magnets 28.

As shown in FIG. 2, the segment magnets 28 are arranged such that the polarities thereof are alternately changed, which arrangement leads to the generation of multi-pole magnetic field around the workpiece 26 (or circumferentially along the inner wall 24a of the vacuum chamber 24). The magnetic flux density of the multi-pole magnetic field strength may be in a range from 0.005 to 0.2T (200 to 2000G), and preferably might range from 0.03 to 0.045T (300 to 450G) by way of example. In such a case, the strength of multi-pole magnetic field is substantially zero (or very week) in the vicinity of the center of the workpiece 26.

According to the inventor's experiment conducted under the following conditions, a magnetic flux density in the vicinity of the inner wall 24a of the chamber 24 was 0.03T (300G). The experimental conditions were such that the diameter D of a circle inscribed in the segment magnets 28 was 450 mm. Further, each of the magnetic members 30 had a trapezoidal cross section in a direction perpendicular to the central axis of the magnetic field generator 22. Still further, each segment magnet 28 had a width W of 40 mm, a thickness TM of 7 mm, and a height L of 120 mm, and the upside and base of the trapezoid was 45.7 mm and 47.4 mm. Still further, each of the magnetic members 30 had a thickness TY of 9 mm and a height L of 120 mm. In this experiment, each segment magnet 28 was a rare-earth magnet with a residual magnetization flux density of 1.3T, and each magnetic member 30 was made of low-carbon steel S15C, and the supporter 32a, 32b was made of aluminum.

The segment magnet 28 is in no way limited to a special one, and may take the form of a rare-earth magnet, a ferrite magnet, an alnico magnet, etc., while the magnetic member 30 may be made of pure iron, carbon-steel, iron-cobalt stainless steel, etc. On the other hand, the supporter 32a (32b) may be made of non-magnetic material such as aluminum, stainless steel, brass, resin, etc.

As mentioned above, it is preferable that the magnetic field strength is substantially zero in the vicinity of the center of the workpiece 26. It is, however, practically sufficient if the magnetic field in the space in which the workpiece 26 is to be positioned is week to such an extent not to adversely affect the plasma treatment of the workpiece. In the above-mentioned experiment, a magnetic flux density less than 420 $\mu$T (4.2 G) was present in the vicinity of the circumference of the workpiece 26.

Figure 4:
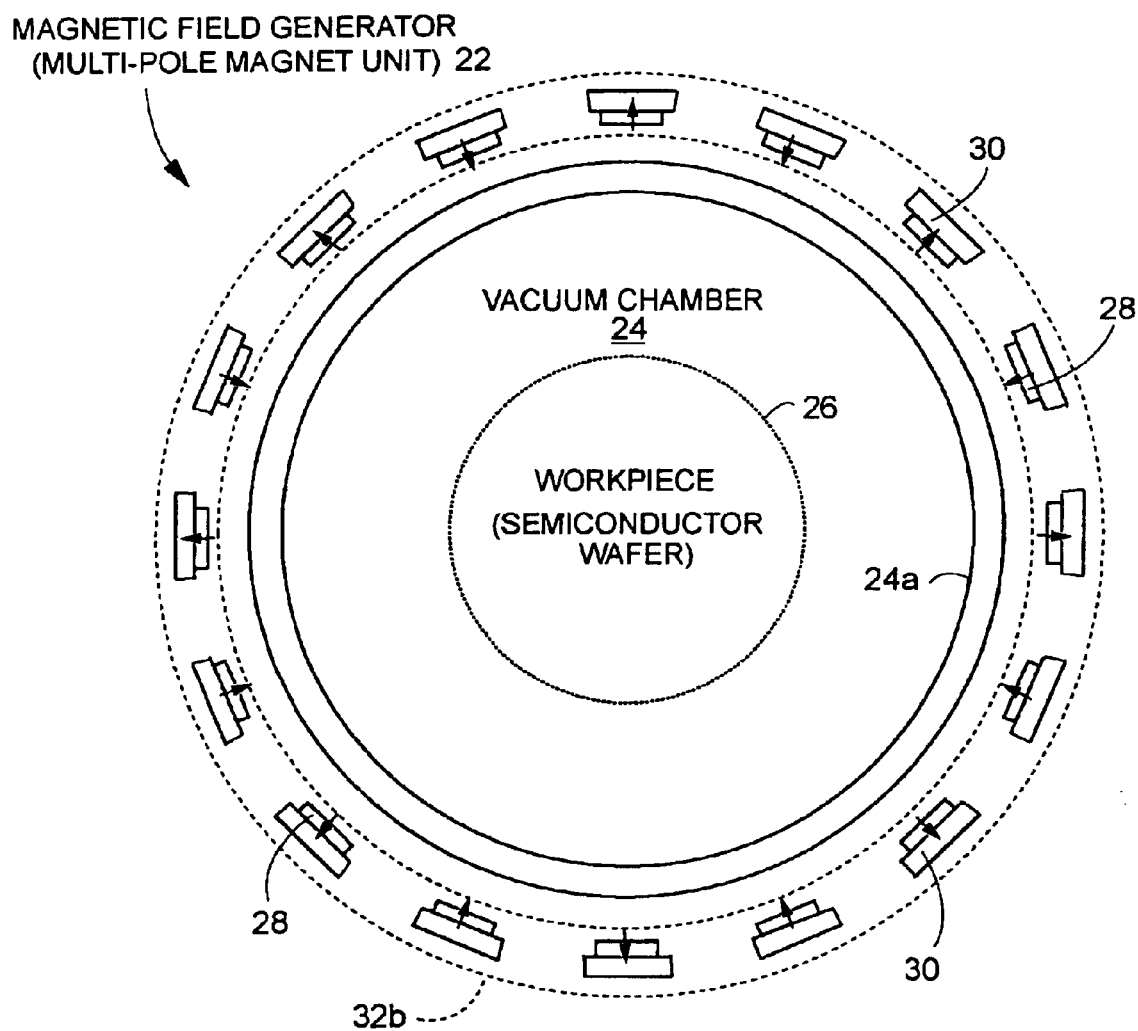
FIG. 4 is a plan view schematically showing a modification of the preferred embodiment of FIG. 2.

FIG. 4 illustrates a first modification of the above-mentioned preferred embodiment of the present invention, wherein the magnetic members 30, which respectively carry no segment magnets 28, are removed or not installed. With this modification, it is possible to reduce the magnetic field strength in the vicinity of the inner wall 24a of the vacuum chamber 24. The inventor of the present invention conducted another experiment under the same conditions as mentioned above while the magnetic members 30 each having no segment magnet 28 are removed as shown in FIG. 4. The experimental result indicated that the magnetic flux density in the vicinity of the inner wall of the chamber 24 was able to be reduced to 0.023T (230G).

Figure 5:
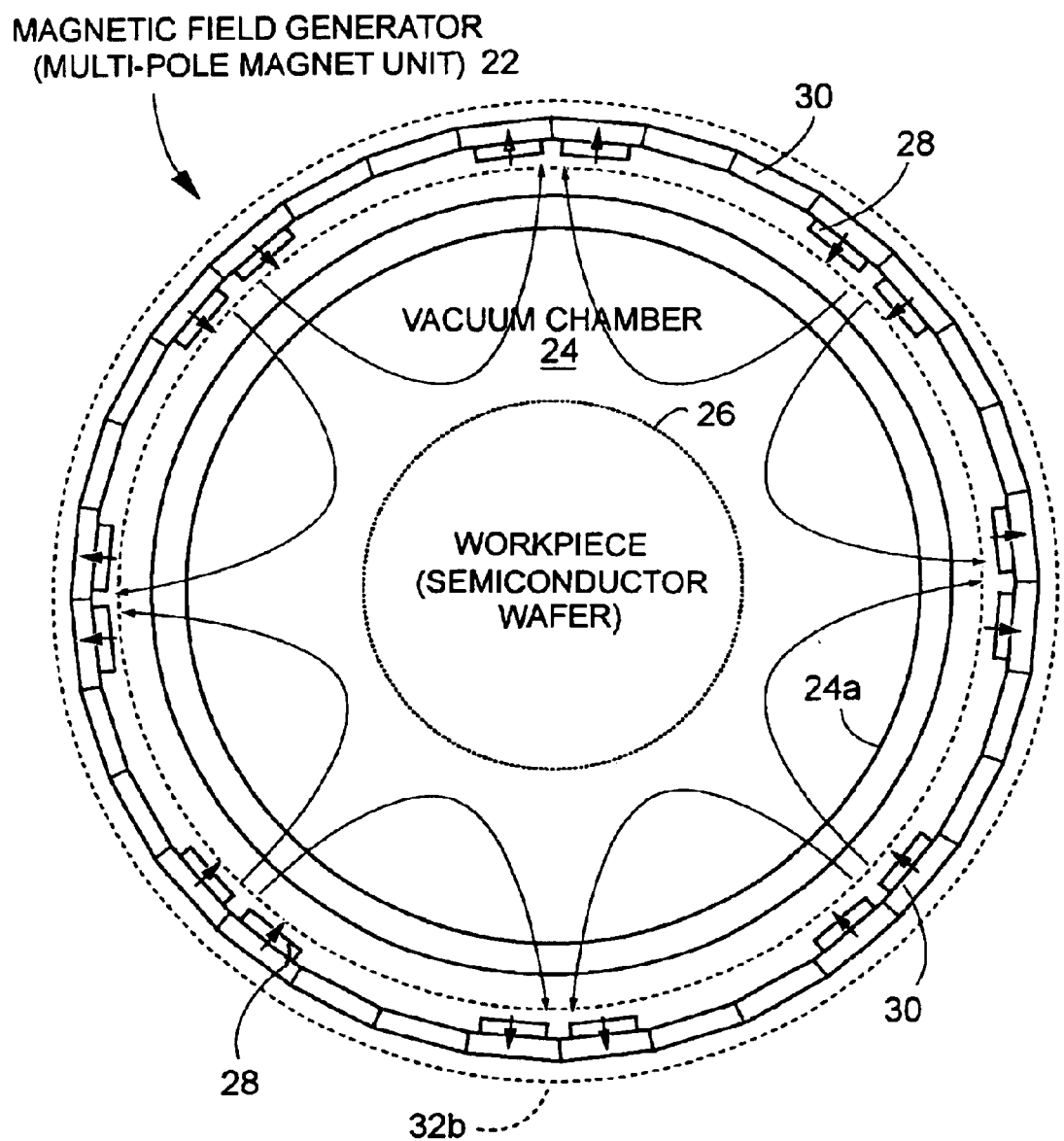
FIG. 5 is a plan view schematically showing another modification of the preferred embodiment of FIG. 2.

FIG. 5 shows a second modification of the above-mentioned preferred embodiment, in which eight pairs of segment magnets 28 are arranged in a manner to be attached to the magnetic members 30 at intervals of two. This arrangement can be realized without difficulty by relocating the magnetic members 30 with and without the segment magnets 28. To this end, it is necessary to detachably install the magnetic members 30 to the supporters 32a and 32b. In the case shown in FIG. 5, an eight-pole magnetic field is generated within the vacuum chamber 24, and the magnetic force lines extend further toward the center of the chamber 24 compared with the embodiment shown in FIG. 2. Accordingly, with this modification, the magnetic field strength can be increased in a space surrounding the workpiece 26 relative to the case shown in FIG. 2.

As an extension of the second modification, it is possible to provide four groups of segment magnets 28 with each group consisting of four magnets 28 arranged in proximity with each other. In this case, four-pole magnetic field is generated, As the number of magnetic poles decreases, the magnetic fluxes extend further inside the vacuum chamber 24.

The magnetic members 30, each of which accompanies the segment magnet as shown in FIGS. 2, 4 and 5, are movably installed in the supporter 32a and 32b in an outward radial direction. In especial, the magnetic members 30 of FIG. 4 are movably installed in the supporter 32a and 32b in both outward and inward radial directions. It is understood that the radial displacement of the magnetic members 30 enables it possible to control the multi-pole magnetic field strength within the vacuum chamber 24.

Figure 6A:
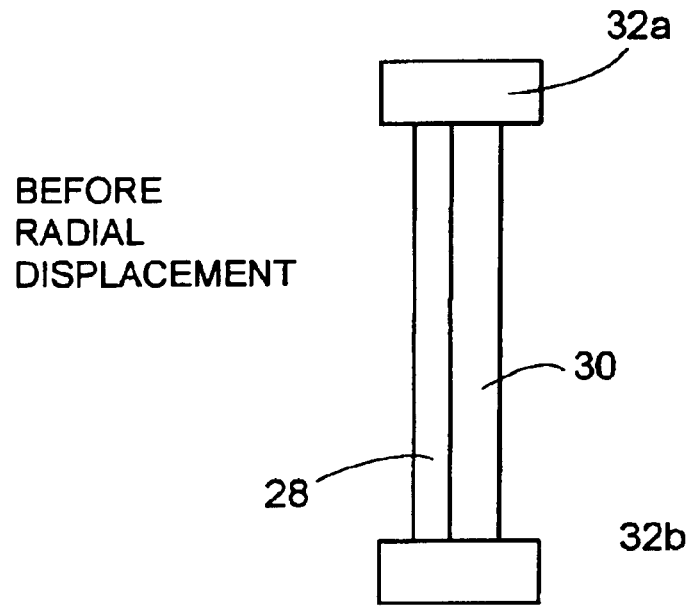
FIGS. 6(A) and 6(B) are schematically illustrating radial displacement of the members which comprise part of the magnetic field generator according to the preferred embodiment and the modifications thereof.
Figure 6B:
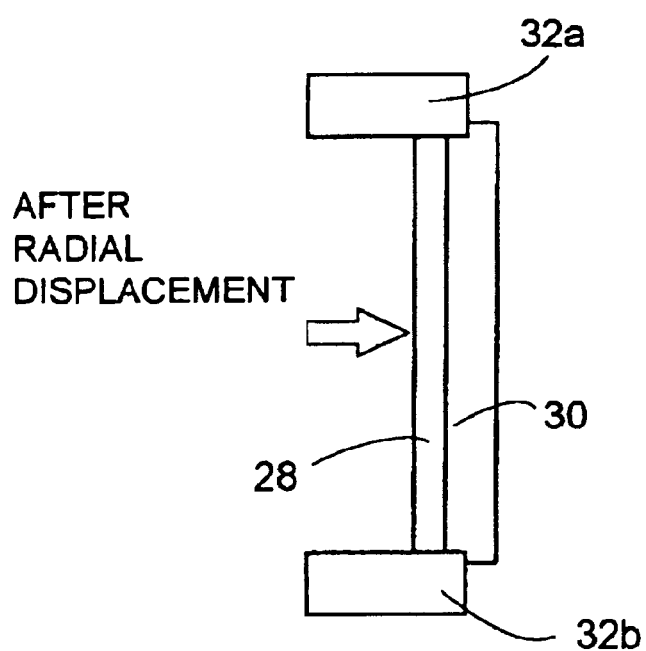

FIG. 6(A) schematically shows a combination of one magnetic member 30 and one segment magnet 28 before being moved in a radial direction, while FIG. 6(B) shows the combination has been radially displaced.

According to still another experiment conducted by the inventor of the present invention, all the magnetic members 30 of FIG. 2, each of which carries the segment magnet, were radially displaced by 20 mm in an outward direction. The experimental results indicated that the magnetic flux density in the vicinity of the inner wall 24a of the vacuum chamber 24 was be able to be reduced to 0.01T (100G).

Figure 7A:
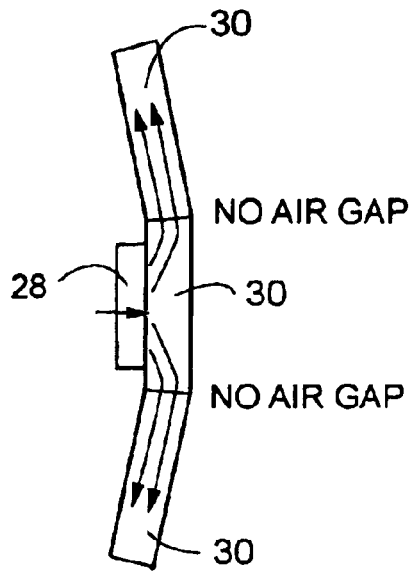
FIGS. 7(A) to 7(C) are drawings for schematically explaining the manners of magnetic fluxes produced in magnetic members with different configurations, which members form part of the magnetic field generator of FIGS. 2 and 5.
Figure 7B:
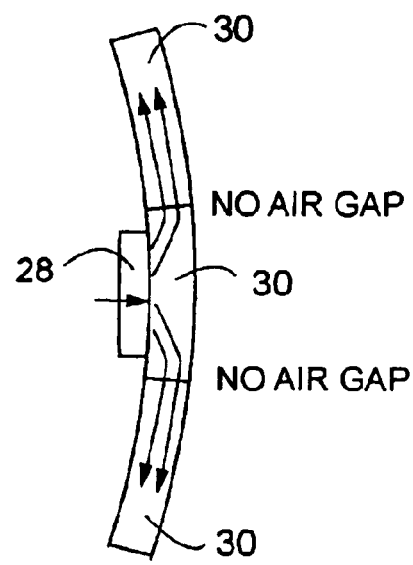
Figure 7C:
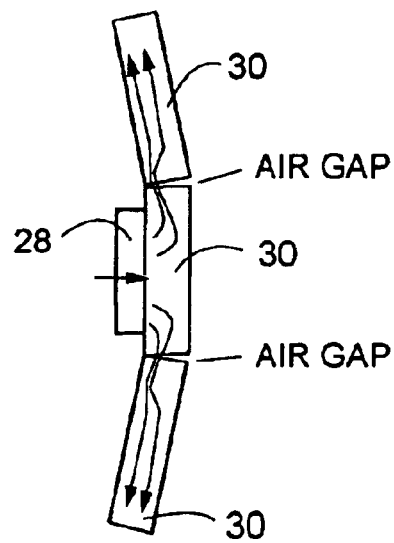

In order to prevent undesirable magnetic flux losses between the magnetic members 30 especially shown in FIGS. 2 and 5, it is highly preferable to tightly contact them so as to leave no air gap therebetween. To this end, each magnetic member 30 is desirably configured such as to have a trapezoidal or fan-shaped cross section in a direction perpendicular to the central axis of the magnetic field generator, as shown in FIGS. 7(A) and 7(B). By way of example, in case the magnetic member 30 has a rectangular cross section (FIG. 7(C)), the magnetic fluxes decreases due to magnetic saturation caused by air gaps with the result of undesirable reduction of the multi-pole magnetic field strength.

However, it is possible to positively use the air gaps between the magnetic members 30 in order to control the multi-pole magnetic field strength. That is to say, if the magnetic members 30 (FIGS. 2 and 5), each of which has no segment magnet thereon, are radially displaced in the outward direction, the air gaps are generated between the adjacent magnetic members 30. Thus, the strength of the multi-pole magnetic field is reduced within the vacuum chamber 24. In other words, such displacement of the magnetic members 30 is able to exhibit the same effects as detaching them from the magnetic field generator 22.

The foregoing descriptions show one preferred embodiment and several modifications thereof. However, other various variants are apparent to those skilled in the art without departing from the scope of the present invention which is only limited by the appended claims. Therefore, the embodiments and modification shown and described are only illustrated, not restrictive.

What is claimed is:

1. A magnetic field generator for generating a multi-pole magnetic field around a workpiece positioned within a vacuum chamber, the magnetic field generator being provided outside the vacuum chamber and comprising:
   a plurality of segment type permanent magnets which are circularly arranged; and
   a plurality of magnetic members which are circularly arranged and to which the segment magnets are selectively attached at inner sides of the circularly arranged magnetic members.

2. The magnetic field generator as claimed in claim 1, further comprising a ring-like supporter by which the magnetic members are detachably supported.

3. The magnetic field generator as claimed in claim 1, each of the magnetic members has a trapezoidal or fan-shaped cross section in a direction perpendicular to the central axis of the magnetic field generator.

4. The magnetic field generator as claimed in claim 1, wherein the magnetic members are respectively displaceable radially with respect to the central axis of the magnetic field generator.

5. The magnetic field generator as claimed in claim 2, each of the magnetic members has a trapezoidal or fan-shaped cross section in a direction perpendicular to the central axis of the magnetic field generator.

6. The magnetic field generator as claimed in claim 2, wherein the magnetic members are respectively displaceable radially with respect to the central axis of the magnetic field generator.

7. The magnetic field generator as claimed in claim 3, wherein the magnetic members are respectively displaceable radially with respect to the central axis of the magnetic field generator.

8. The magnetic field generator as claimed in claim 5, wherein the magnetic members are respectively displaceable radially with respect to the central axis of the magnetic field generator.

9. The magnetic field generator as claimed in claim 1, wherein the segment magnets are arranged such that their respective polarities are alternated so as to generate the multi-pole magnetic field.

10. The magnetic field generator as claimed in claim 1, wherein a number of the segment magnets is less than a number of the magnetic members.

11. The magnetic field generator as claimed in claim 1, wherein adjacent ones of the segment magnets are separated by at least one of the magnetic members which is interposed between the adjacent segment magnets.

* * * * *